United States Patent [19]

Berg et al.

[11] Patent Number: 4,780,087

[45] Date of Patent: Oct. 25, 1988

[54] ELECTRICAL CONNECTOR FOR CIRCUIT BOARDS

[75] Inventors: William E. Berg, Portland; Andrew E. Finkbeiner, Tigard, both of Oreg.

[73] Assignee: Tektronix, Inc., Beaverton, Oreg.

[21] Appl. No.: 58,083

[22] Filed: Jun. 4, 1987

[51] Int. Cl.⁴ .................... H05K 1/00

[52] U.S. Cl. .................... 439/62; 439/630; 439/92; 439/714

[58] Field of Search .................... 439/55, 59, 60, 61, 439/62, 65, 66, 67, 74, 77, 78, 81, 82, 85, 92, 493, 629, 630, 631, 633, 634, 636, 637, 607, 684, 688, 723, 724, 714

[56] References Cited

U.S. PATENT DOCUMENTS

| | | | |
|---|---|---|---|
| 2,971,179 | 2/1961 | Hauer | 439/61 |
| 2,994,056 | 7/1961 | Fox | 439/62 |
| 3,587,029 | 6/1971 | Knowles | 439/62 |
| 3,638,166 | 1/1972 | Steipe | 439/629 |
| 3,663,921 | 5/1972 | Richard | 439/62 |
| 4,577,922 | 3/1986 | Stipanuk et al. | 439/629 |

OTHER PUBLICATIONS

"Double Contact Connector", IBM Tech. Disclosure Bulletin, J. J. Shea, vol. 9, No. 2, Jul. 66, pp. 148, 149.

*Primary Examiner*—David Pirlot

*Attorney, Agent, or Firm*—John Smith-Hill; Peter J. Meza

[57] ABSTRACT

An edge connector for connecting a conductor run on an edge region of a first circuit board to a conductor run of a second circuit board comprises a plate of dielectric material. The plate has a generally U-shaped portion, with the two limbs of the U defining a slot therebetween. The plate of dielectric material may be attached to the second circuit board in a position such that an edge region of the first circuit board may be received in the slot. A signal conductor is adhered to one main face of the plate of dielectric material and has two end portions. One end portion of the signal conductor projects from one of the limbs of the U into the slot for engaging a conductor run on the edge region of the first board, and the other end portion projects from the plate at a location remote from the slot for contacting a conductor run of the second board.

2 Claims, 2 Drawing Sheets

ELECTRICAL CONNECTOR FOR CIRCUIT BOARDS

BACKGROUND OF THE INVENTION

This invention relates to an electrical connector for circuit boards, and particularly to an edge connector having transmission line characteristics.

It is conventional for circuit boards carrying functional components of an electronic instrument to be connected together using a backplane circuit board. Generally, the functional circuit boards are disposed perpendicular to the backplane board, and conductor runs of the functional boards are connected to conductor runs of the backplane board by means of edge connectors which are carried by the backplane board. A conventional edge connector comprises resilient metal contacts which are secured to the backplane board and are in electrically-conductive relationship with conductor runs of the backplane board, and a contact positioner which is made of dielectric material and is held in position by mechanical arrangement with the metal contacts. The metal contacts are arranged in two rows. The contact positioner has two rows of teeth corresponding to the two rows of contacts, and the contacts and the corresponding teeth are in interdigitated relationship. The two rows of teeth are separated by a slot for receiving an edge region of the functional board. When the edge region of the functional board is received in the slot defined between the rows of teeth of the contact positioner, the metal contacts engage conductor runs of the functional board and establish electrically-conductive contact between the conductor runs of the functional board and the conductor runs of the backplane board. An arrangement of this kind may be used to connect a plug-in module to a mainframe or host instrument. When the plug-in module is inserted into the host instrument, a functional board of the plug-in module engages an edge connector on the backplane board of the host instrument and electrical connection is thereby established between functional components of the plug-in module and functional components of the host instrument.

A problem that arises in some instruments is that the tolerance on the position of the edge region of the functional board relative to the backplane board is quite large, and consequently the metal contacts must be quite long in order to ensure that electrical contact will reliably be made. In conventional edge connectors, the metal contacts do not have a transmission line configuration and therefore they do not have good high frequency performance.

SUMMARY OF THE INVENTION

A preferred embodiment of the present invention is an edge connector for connecting a conductor run on an edge region of a first circuit board to a conductor run of a second circuit board when the two circuit boards are disposed transversely to one another with the edge region of the first board presented towards the second board. The connector comprises a plate of dielectric material. The plate has a generally U-shaped portion, with the two limbs of the U defining a slot therebetween. The plate of dielectric material may be attached to the second circuit board in a position such that the edge region of the first circuit board may be received in the slot. A signal conductor is adhered to one main face of the plate of dielectric material and has two end portions. One end portion of the signal conductor projects from one of the limbs of the U into the slot for engaging a conductor run on the edge region of the first board, and the other end portion projects from the plate at a location remote from the slot for contacting a conductor run of the second board.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 3:
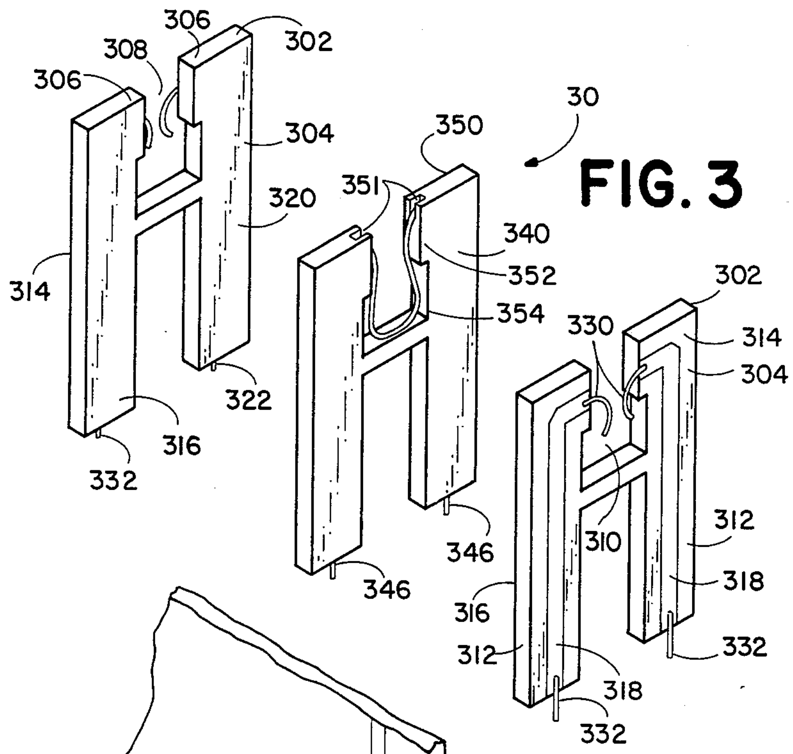
FIG. 3 is an exploded view of a section of the FIG. 1 connector.
Figure 1:
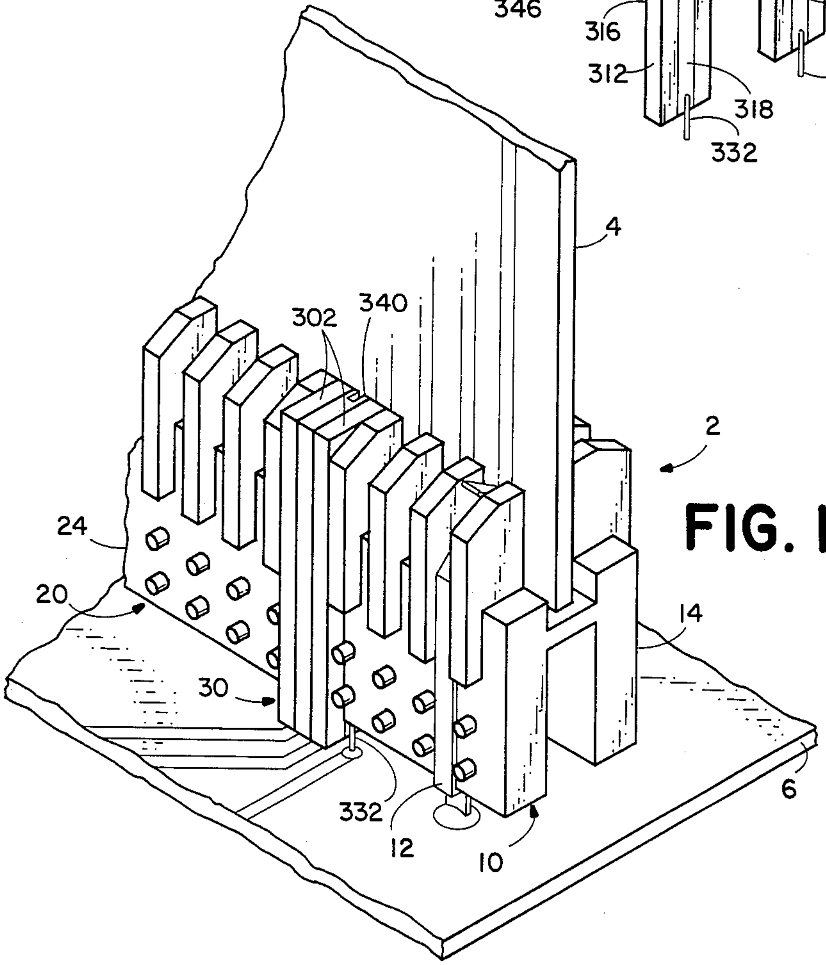
FIG. 1 is a perspective view of an edge connector embodying the present invention.
Figure 2:
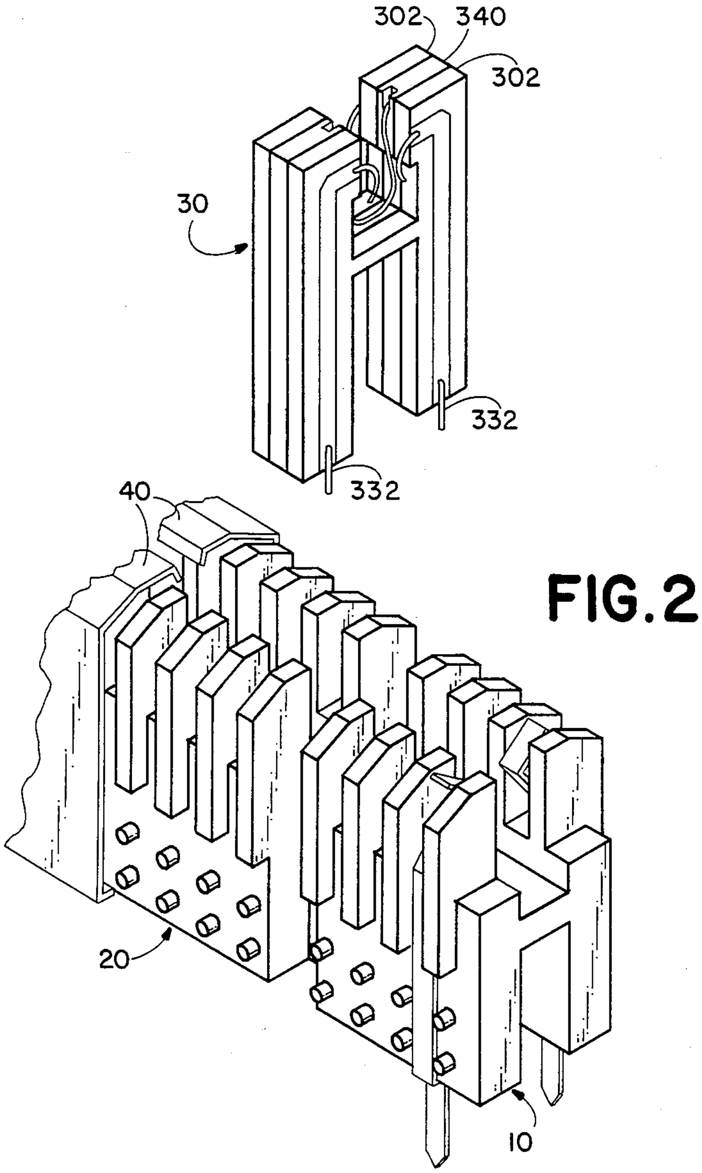
FIG. 2 is a partially exploded view of the FIG. 1 edge connector.

The illustrated edge connector 2 is used to provide electrical connection between a functional circuit board 4 and a backplane circuit board 6. Each circuit board has signal conductor runs and power supply conductors, including a ground plane. Some of the signal conductor runs form transmission lines in conjunction with the ground plane. The edge connector 2 is in three sections 10, 20 and 30. The sections 10 and 20 are of conventional form, comprising resilient metal contacts 12 (of which only one is shown in FIG. 1) and contact positioners 14, 24. A protective cover 40 (FIG. 2) is fitted over the sections 10, 20 and 30. The connector section 30 comprises two plates 302 of dielectric material each having an upper portion 304 which is generally U-shaped. Jaw regions 306 of the U-shaped portion 304 define a throat 308 through which access may be had to an interior space 310 which is partially bounded by the plate. Each plate 302 also has two leg portions 312, so that the overall configuration of the plate is similar to an H but with the jaw regions 306 at the top. Each plate 302 has two main faces 314 and 316. On the face 314, the plate is provided with two signal conductor runs 318 extending respectively along the two vertical limbs of the H, and on its opposite main face 316 it is provided with a ground plane 320. The plate 302 with conductor runs 318 and the ground plane 320 may be fabricated using conventional techniques such as are employed in fabrication of etched circuit boards. The width of the signal conductor runs 318, their spacing from the ground plane 320, and the nature of the dielectric material of the plate 302 are selected so that each signal conductor 318 and the ground plane 320 form a transmission line of which the characteristic impedance substantially matches the characteristic impedance of the transmission lines on the circuit boards. Spring contact wires 330 are secured to the conductor runs 318 where they traverse the jaw regions 306, e.g. by soldering or other means, and each projects into the throat 308 defined between the jaw regions. Contact wires 332 are also attached, e.g. by soldering or other means, such as welding, to the conductor runs 318 at the bottom of the vertical limbs of the H.

The connector section 30 also comprises a plate 340 which is of essentially the same configuration as each dielectric plate 302, but is made of conductive material, such as brass. The plate 340 is formed with holes in the bottoms of the leg portions 344, and contact wires 346 are fitted in these holes. An additional contact wire 348 is secured to the jaw regions 352 of the plate 340. This is achieved by cutting slots 351 in the upper surfaces 350 of the jaw regions and fitting the ends of the wire 348 in the slots respectively. The ends of the wire 348 may be secured in the slots, e.g., by soldering or other means. The contact wire 348 includes a loop 354 which projects into the interior space bounded by the U-shaped portion of the plate 340.

The metal plate 340 is sandwiched between the two dielectric plates 302, with the ground planes 320 of the dielectric plates confronting opposite respective sides of the metal plate 340. The dielectric plates are attached to the metal plate, e.g., by use of a B-stage epoxy adhesive material or by soldering.

The connector section 30 is incorporated in the edge connector at a location at which good high frequency performance is required, i.e. at a location at which the conductor runs that are connected by the edge connector carry high frequency signals. The contact wires 332 are connected to signal conductor runs of the backplane circuit board 6 in conventional fashion, and the contact wires 346 are connected in conventional fashion to the ground plane of the backplane board. An edge region of the functional circuit board 4 is fitted in the edge connector, and electrically-conductive pressure contact is established between signal conductor runs of the functional board and the contact wires 330 and between the ground plane of the functional board and the wire 348. The U-shaped configuration of the upper portion of the connector section 30 accommodates a wide tolerance on the position of the functional circuit board relative to the backplane circuit board, but the configuration of the connector section 30, incorporating a ground plane, provides good high frequency performance.

It will be appreciated that the present invention is not restricted to the particular embodiment that has been described and illustrated, and that variations may be made therein without departing from the scope of the invention as defined in the appended claims and equivalents thereof. For example, instead of fabricating the connector section 30 from the H-shaped plates 302 and 304 and then bonding the plates together, the connector section may be made from material that is commercially available and comprises a metal core plate having boards of epoxy glass laminated thereto, the boards of the epoxy glass being clad with copper on their outer sides. The conductor runs 318 would be formed by patterning the copper cladding and the core plate would serve the purpose of both the ground planes 320 and the plate 302.

We claim:

1. A connector for connecting a plurality of conductor runs on an edge region of a first circuit board with a plurality of conductor runs of a second circuit board when the two circuit boards are disposed transversely to one another with the edge region of the first circuit board presented towards the second board, the conductor runs of the edge region of the first circuit board each having a first characteristic impedance and the second circuit board having a first ground plane, comprising:

a first plate of dielectric material having first and second opposite main faces, the plate comprising a generally U-shaped portion having two limbs which are separated by a slot and a base which limits the slot, the plate being attachable to the second circuit board in a position such that the edge region of the first circuit board may be inserted into the slot, a first signal conductor adhered to the first main face of said first plate of dielectric material and having a first end portion which projects from one of the limbs of the U-shaped portion into the slot for engaging a conductor run on the edge region of the first board, and also having a second end portion which projects from the plate at a location remote from the first end portion for contacting a conductor run of the second circuit board, a second ground plane adhered to the second main face of the first plate of dielectric material, a plate of conductive material having first and second opposite main faces, the plate of conductive material comprising a generally U-shaped portion and being secured to the first plate of dielectric material with the first main face of the plate of conductive material in confronting relationship with the second main face of the first plate of dielectric material, such that said signal conductor forms a transmission line, the characteristic impedance of which is substantially equal to the first characteristic impedance, thereby improving the frequency performance of said connector, a second plate of dielectric material having first and second opposite main faces, the second plate comprising a generally U-shaped portion having two limbs which are separated by a slot and a base which limits the slot, and a second signal conductor adhered to the first main face of the second plate of dielectric material and having a first end portion which projects from one of the limbs of the U-shaped portion into the slot for engaging a conductor run on the edge region of the first board, and also having a second end portion which projects from the plate at a location remote from the first end portion for contacting a conductor run of the second board, the second plate of dielectric material being secured to the plate of conductive material with the second main face of the plate of conductive material in confronting relationship with the second main face of the second plate of dielectric material.

2. A connector according to claim 1, further comprising a ground plane adhered to the second main face of the second plate of dielectric material and in direct electrically-conductive contact with the plate of conductive material.

* * * * *